(12) United States Patent
Lee et al.

(10) Patent No.: US 9,472,598 B2
(45) Date of Patent: Oct. 18, 2016

(54) LIGHT EMITTING DEVICE COMPRISING ORGANIC LIGHT-EMITTING ELEMENTS ELECTRICALLY CONNECTED IN SERIES

(71) Applicant: LG DISPLAY CO., LTD., Seoul (KR)

(72) Inventors: Yeon Keun Lee, Daejeon (KR); Kyoung Sik Moon, Daejeon (KR); Seong Su Jang, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/099,648

(22) Filed: Dec. 6, 2013

(65) Prior Publication Data

US 2014/0097423 A1    Apr. 10, 2014

Related U.S. Application Data

(63) Continuation of application No. PCT/KR2012/004590, filed on Jun. 11, 2012.

(30) Foreign Application Priority Data

Jun. 9, 2011 (KR) .......................... 10-2011-0055643

(51) Int. Cl.
*H01L 27/32* (2006.01)

(52) U.S. Cl.
CPC ... *H01L 27/3204* (2013.01); *H01L 2251/5361* (2013.01)

(58) Field of Classification Search
CPC ............... H01L 51/56; H01L 51/0072; H01L 51/0067; H01L 51/5056; H01L 27/3244; H01L 51/0056; H01L 21/265; H01L 27/3204; H01L 2251/5361; B32B 2457/206; B32B 7/02; B32B 17/00; B32B 2250/02; B32B 2250/244; B32B 2255/10; B32B 2307/04

USPC .......................... 257/88, 40; 359/599; 216/24
See application file for complete search history.

(56) References Cited

U.S. PATENT DOCUMENTS

| | | | | |
|---|---|---|---|---|
| 6,299,337 | B1 * | 10/2001 | Bachl | F21S 48/215 257/E25.028 |
| 7,122,398 | B1 * | 10/2006 | Pichler | H01L 31/1876 136/244 |
| 2005/0230679 | A1 | 10/2005 | Yonemoto et al. | |
| 2005/0248935 | A1 | 11/2005 | Strip et al. | |

(Continued)

FOREIGN PATENT DOCUMENTS

| | | |
|---|---|---|
| CN | 101416329 | 4/2009 |
| CN | 101523634 | 9/2009 |

(Continued)

OTHER PUBLICATIONS

Machine English Translation JP2007_335146A, Yoshihide et al.*

*Primary Examiner* — John P Dulka
*Assistant Examiner* — Charles R Peters
(74) *Attorney, Agent, or Firm* — Dentons US LLP

(57) ABSTRACT

The present invention relates to an organic light-emitting element comprising a first electrode, a second electrode, and an organic layer interposed between said first electrode and said second electrode, and to a light-emitting device including the same, wherein in the organic light-emitting element, a connection electrode for electrically connecting two or more elements in serial is formed on a non-light-emitting surface of said organic light-emitting element. The invention can electrically connect a plurality of organic light-emitting elements easily, and can be implemented as a large-scale lighting or display device or the like.

9 Claims, 5 Drawing Sheets

(56) References Cited

U.S. PATENT DOCUMENTS

| | | | |
|---|---|---|---|
| 2006/0125410 A1* | 6/2006 | Duggal | G09F 9/33 315/169.3 |
| 2007/0090387 A1* | 4/2007 | Daniels et al. | 257/99 |
| 2007/0274067 A1* | 11/2007 | Sloan | F21S 4/007 362/219 |
| 2007/0279104 A1 | 12/2007 | Satoh | |
| 2010/0157585 A1 | 6/2010 | Diekmann et al. | |

FOREIGN PATENT DOCUMENTS

| | | |
|---|---|---|
| DE | 102006016373 A1 | 10/2007 |
| JP | 06-290869 | 10/1994 |
| JP | 2002334779 A | 11/2002 |
| JP | 2005302605 | 10/2005 |
| JP | 2007-173564 A | 7/2007 |
| JP | 2007173564 A | 7/2007 |
| JP | 2007-335146 A * | 12/2007 |
| JP | 2007-335146 A | 12/2007 |
| JP | 2007320271 A | 12/2007 |
| JP | 2007335146 A | 12/2007 |
| JP | 2009238455 A | 10/2009 |
| KR | 1020040014313 A | 2/2004 |
| KR | 2007-536708 A | 12/2007 |
| WO | 2005/107411 A2 | 11/2005 |

* cited by examiner (a)

(b)

LIGHT EMITTING DEVICE COMPRISING ORGANIC LIGHT-EMITTING ELEMENTS ELECTRICALLY CONNECTED IN SERIES

This application is a Continuation Bypass Application of International Patent Application No. PCT/KR2012/004590, filed Jun. 11, 2012, which claims priority to and the beneifit of Korean Patent Application No. 10-2011-0055643 filed on Jun. 9, 2011, in the Korean Intellectual Property Office, all of which are hereby incorporated by reference.

BACKGROUND

1. Field of the Invention

The present invention relates to an organic light-emitting element and a light-emitting device including the same.

2. Discussion of Related Art

An organic light-emitting element is a self-light-emitting element using electroluminescence, in which light is emitted when an electric current flows in an organic light-emitting compound. The organic light-emitting element has advantages of an excellent thermostability and a low driving voltage, and, thus, it has drawn attention as a next-generation element in various fields of industry, such as the display industry and the lighting industry.

However, the organic light-emitting element is an element requiring a low voltage and a high electric current, and as an area of the element is increased, a sheet resistance of a transparent electrode included in the element is increased. An electrode layer in a layered structure of the organic light-emitting element has a limited electrical conductivity. In particular, reduction in sheet resistance of a transparent electrode layer is limited. If each organic light-emitting element is large-scaled, a sheet resistance of a transparent electrode is increased and a partial voltage drop may occur. Currently, a luminous efficiency of an organic light-emitting element is about 30 lm/W in a white element having a two-stack structure, and under this circumstance, in order to obtain a luminous flux of about 600 lm which corresponds to a luminous flux of a single incandescent light bulb, an organic light-emitting element having an area of about 30×30 cm$^2$ is required.

Typically, in order to manufacture an element having an area of about 10×10 cm$^2$ and uniformly emitting light, a transparent electrode having a sheet resistance of about 1 Ω/□ is required. However, it is almost impossible for an ITO electrode to have a sheet resistance of about 1 Ω/□. Therefore, an additional auxiliary electrode is needed. If aluminum metal having an aperture ratio of 90% is used as an auxiliary electrode, an aluminum sheet having a thickness of about 280 nm is needed to obtain a sheet resistance of 1 Ω/□.

However, a sheet resistance of a transparent electrode decreases in inverse proportion to an area of a light-emitting element. Therefore, in order for an organic light-emitting element having an area of about 30×30 cm$^2$ to emit light with a uniform luminance, a transparent electrode of about 1 Ω/□ is required. In order to obtain a sheet resistance of about 1 Ω/□, aluminum used as an auxiliary electrode needs to be formed to have a thickness of 2.8 μm. It is inefficient to deposit metal to such a thickness, and such a thickness makes it difficult to perform a photolithography process.

Therefore, in order to replace an incandescent light bulb or a fluorescent lamp having a luminous flux greater than the incandescent light bulb with an organic light-emitting element having a current luminous efficiency, it is efficient to arrange multiple organic light-emitting elements, each having an area of 10×10 cm$^2$, rather than manufacture an organic light-emitting element having an area of 30×30 cm$^2$ or more.

SUMMARY OF THE INVENTION

1. Technical Problem

The present invention provides an organic light-emitting element in which it is simple to perform electrical connection required for multiple electrical organic light-emitting elements to emit light. Further, the present invention provides a light-emitting device in which it is easy to add or replace organic light-emitting elements.

2. Technical Solution

The present invention relates to an organic light-emitting element comprising a first electrode, a second electrode, and an organic layer interposed between the first electrode and the second electrode, and in the organic light-emitting element, a connection electrode for electrically connecting two or more elements in series is formed on a non-light-emitting surface of the organic light-emitting element. Further, the present invention relates to a light-emitting device including the organic light-emitting element.

3. Effect of the Invention

As described above, an organic light-emitting element according to the present invention allows multiple organic light-emitting elements to be electrically connected with each other with ease.

DETAILED DESCRIPTION OF EXEMPLARY EMBODIMENTS

Figure 1:
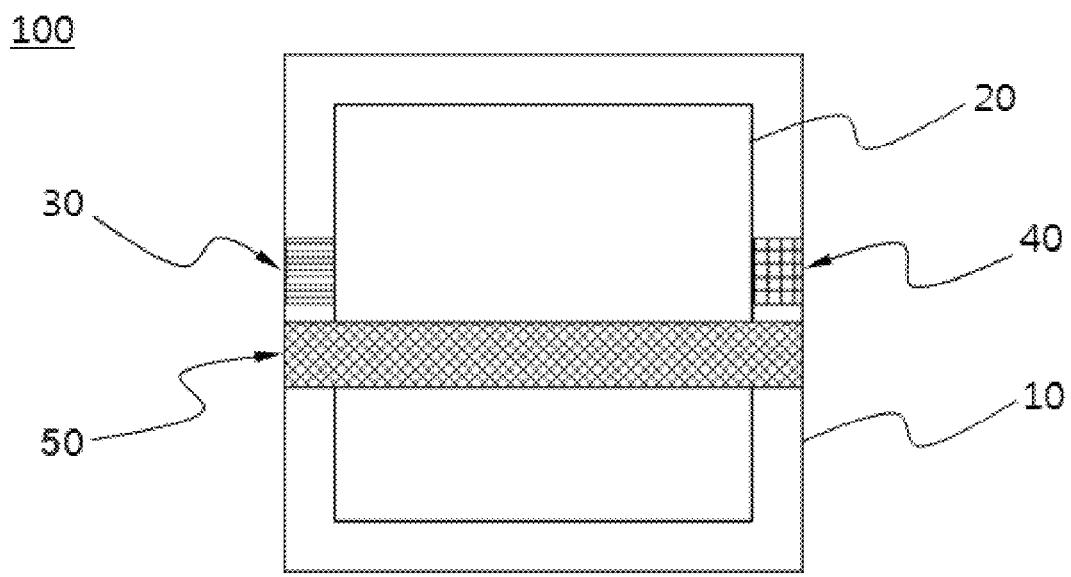
FIG. 1 is a schematic diagram showing an organic light-emitting element according to an exemplary embodiment of the present invention.

Hereinafter, exemplary embodiments of the present invention will be described in detail. However, the present invention is not limited to the embodiments disclosed below, but can be implemented in various forms. The following embodiments are described in order to enable those of ordinary skill in the art to embody and practice the present invention.

Although the terms first, second, etc. may be used to describe various elements, these elements are not limited by these terms. These terms are only used to distinguish one element from another. For example, a first element could be termed a second element, and, similarly, a second element could be termed a first element, without departing from the scope of exemplary embodiments. The term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of exemplary embodiments. The singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components and/or groups thereof, but do not preclude the presence or addition of one or more other features, integers, steps, operations, elements, components and/or groups thereof.

With reference to the appended drawings, exemplary embodiments of the present invention will be described in detail below. To aid in understanding the present invention, like numbers refer to like elements throughout the description of the figures, and the description of the same elements will be not reiterated.

The present invention provides an organic light-emitting element comprising a first electrode, a second electrode, and an organic layer interposed between the first electrode and the second electrode, and in the organic light-emitting element, a connection electrode for electrically connecting two or more elements in series is formed on a non-light-emitting surface of the organic light-emitting element.

An organic light-emitting element is stable when it is constant-current driven to uniformly maintain an electric current. As a temperature of an organic substance increases, a terminal resistance of the organic light-emitting element decreases when it is driven. If the organic light-emitting element is constant-current driven for a long time, the element generates heat due to constant driving and a resistance in the element decreases, and, thus, an electric current higher than an initially set value flows in the element. If the higher electric current flows therein, more heat is generated, which starts a vicious circle. As a result, since the organic light-emitting element is driven with a luminance higher than an adequate level, a life of the element can be reduced. For this reason, there has been used capable of controlling an electric current having an initially set value to flow in the organic light-emitting element even if a temperature of the organic light-emitting element is increased. It is typically used when an inorganic light-emitting element is driven.

Typically, in a serial connection, a cathode terminal or an anode terminal of a first element is connected to one terminal of a power supply and the other terminal of the power supply is connected to the last element of the elements connected in series. However, in the serial connection, it is inconvenient to add an element after an electrical connection is completed, and when the last element is connected in series to the power supply, a connection wire may be shorter or longer than necessary.

By comparison, in a light-emitting device including the organic light-emitting element according to the present invention, even if multiple organic light-emitting elements connected in series are driven, an electrical connection between the light-emitting device and a power supply is completed by the power supply and a first element. Therefore, it is very simple to add or reduce an element thereafter.

In the organic light-emitting element according to the present invention, the first electrode and the second electrode may include connection terminals, respectively, that can be extended and have electrical connection portions. For example, a connection terminal of the first electrode may be electrically connected to a power supply or a connection terminal of a second electrode of another organic light-emitting element, and the connection terminal of the second electrode may be electrically connected to a connection terminal of a first electrode of still another organic light-emitting element.

Further, the connection electrode formed on the non-light-emitting surface of the organic light-emitting element may be electrically connected to the power supply or a connection electrode of another organic light-emitting element. A shape of the connection electrode is not particularly limited, and the connection electrode may use an electrical wire for connection or may be formed in a linear shape, a curved shape or a branched shape.

The number of connection electrodes formed on the non-light-emitting surface of the organic light-emitting element may be one or two or more, and if two or more connection electrodes are formed, the connection electrodes may be connected to each other.

The connection electrode may include a connection terminal that can be extended and has an electrical connection portion. To be specific, the connection terminal included in the connection electrode may be electrically connected to the power supply or a connection terminal of a connection electrode of another organic light-emitting element.

In an organic light-emitting element according to an exemplary embodiment of the present invention, the first electrode, the second electrode, and the connection electrode may include connection terminals, respectively, that can be extended and have electrical connection portions, and the first electrode, the second electrode, and the connection electrode may be electrically connected by means of contacts between the connection terminals. The connection terminals may include groove portions or protrusion portions, and the contacts between the connection terminals may be made by means of engagement between the groove portions and the protrusion portions.

For example, connection terminals connected to the first electrode and one side of the connection electrode include groove portions, and connection terminals connected to the second terminal and the other side of the connection electrode include protrusion portions, and a contact between connection terminals may be made by means of engagement between a connection terminal including a groove portion and a connection terminal including a protrusion portion. As another example, connection terminals connected to the second electrode and one side of the connection electrode include groove portions, and connection terminals connected to the first electrode and the other side of the connection electrode include protrusion portions, and a contact between connection terminals may be made by means of engagement between a connection terminal including a groove portion and a connection terminal including a protrusion portion.

The connection terminal is not particularly limited as long as it can be electrically connected. For example, the connection terminal may be a covered electrical wire, a metal plate, a metal tape, a printed circuit board (PCB) or a flexible printed circuit board (FPCB).

The first electrode and/or the second electrode included in the organic light-emitting element according to the present invention may be light-transmitting. For example, the organic light-emitting element may be a top-emission type element or a bottom-emission type element. An electrode adjacent to a light-emitting surface may be made of a light-transmitting material.

For example, the first electrode may be a cathode and may include one or more selected from the group consisting of indium tin oxide (ITO), indium zinc oxide (IZO), and zinc oxide (ZnO).

The connection electrode is not particularly limited as long as it is a conductive material and may include metal or its oxide. The metal may include Al, Cu or the like, and may be coated with an insulting material.

The organic layer includes a light-emitting layer and is configured as a layered structure including one or more selected from the group consisting of a hole injection layer, a hole transport layer, an electron transport layer, and an electron injection layer. The layered structure may be repeated at least once. Further, the organic layer may include a sealing layer if necessary.

Further, the present invention provides a light-emitting device including a multiple number (k, k is an integer of 2 or more) of the organic light-emitting elements. To be specific, the light-emitting device has a structure in which multiple organic light-emitting elements are electrically connected in series. The number of the organic light-emitting elements connected in the light-emitting device according to the present invention may vary depending on an area or a shape of a display device or a lighting device.

In an exemplary embodiment of the present invention, the light-emitting device is a light-emitting device in which the k organic light-emitting elements (k is an integer of 2 or more) are electrically connected in series. In the light-emitting device, a first electrode of a first organic light-emitting element connected to a power supply is connected to an anode (+) terminal of the power supply, and a connection terminal of the first organic light-emitting element is connected to a cathode (−) terminal of the power supply; a first electrode of an nth organic light-emitting element (n is an integer between 0 and k−1) connected between the first organic light-emitting element and a kth organic light-emitting element is connected to a second electrode of a n−1th organic light-emitting element, and a connection electrode of the nth organic light-emitting element is connected to a connection electrode of the n−1 th organic light-emitting element; and a first electrode of the kth organic light-emitting element is connected to a second electrode of a k−1th organic light-emitting element, a connection electrode of the kth organic light-emitting element is connected to a connection electrode of the k−1th organic light-emitting element, and a second electrode of the kth organic light-emitting element is connected to the connection electrode of the kth organic light-emitting element.

As another example, the light emitting device is a light emitting device in which the k organic light-emitting elements (k is an integer of 2 or more) are electrically connected in series. In the light-emitting device, a second electrode of a first organic light-emitting element connected to a power supply is connected to a cathode (−) terminal of the power supply, and a connection terminal of the first organic light-emitting element is connected to an anode (+) terminal of the power supply; a first electrode of an nth organic light-emitting element (n is an integer between 0 and k−1) connected between the first organic light-emitting element and a kth organic light-emitting element is con-nected to a second electrode of a n−1th organic light-emitting element, and a connection electrode of the nth organic light-emitting element is connected to a connection electrode of the n−1th organic light-emitting element; and a first electrode of the kth organic light-emitting element is connected to a second electrode of a k−1th organic light-emitting element, a connection electrode of the kth organic light-emitting element is connected to a connection electrode of the k−1th organic light-emitting element, and a second electrode of the kth organic light-emitting element is connected to the connection electrode of the kth organic light-emitting element.

In the light-emitting device, the first electrode, the second electrode, and the connection electrodes include connection terminals, respectively, that can be extended and have electrical connection portions, and one or more connections among the power supply, the electrodes, and the connection electrodes may be serial electrical connections by means of contacts between the connection electrodes.

For example, in the light-emitting device, connection terminals connected to the first electrode and one side of the connection electrode include groove portions, respectively, and connection terminals connected to the second terminal and the other side of the connection electrode include protrusion portions, respectively, and a contact between connection terminals may be made by means of engagement between a connection terminal including a groove portion and a connection terminal including a protrusion portion. As another example, in the light-emitting device, connection terminals connected to the second electrode and one side of the connection electrode include groove portions, respectively, and connection terminals connected to the first electrode and the other side of the connection electrode include protrusion portions, respectively, and a contact between connection terminals may be made by means of engagement between a connection terminal including a groove portion and a connection terminal including a protrusion portion.

A kind of the power supply used in the light-emitting device is not particularly limited and the power supply may include, for example, a constant current driver. In order to connect multiple organic light-emitting elements and drive them as an illumination source, it is simple and clear to connect the organic light-emitting elements in series and use a constant current driver as a power supply. Some constant current drivers on the market are manufactured to output a constant current regardless of the number of elements connected in series, in the range of voltage that can be output from the drivers. The present invention provides an organic light-emitting element in which there is formed a connector capable of easily connecting from a single element to multiple elements in series, in the range of a driver output voltage when a constant current driver is used, and a light-emitting device including the same.

Further, the light-emitting device according to the present invention is not particularly limited as long as it includes an organic light-emitting element, and may be, for example, a lighting device or a display device.

DETAILED DESCRIPTION OF EXEMPLARY EMBODIMENTS

Hereinafter, the present invention will be explained in detail with reference to the accompanying drawings of a light-emitting device according to the present invention, but the scope of the present invention is not limited thereto.

FIG. 1 is a schematic diagram showing an organic light-emitting element according to an exemplary embodiment of the present invention. An organic light-emitting element 100 has a square shape and a layered structure including a cathode, an anode, and an organic layer interposed between the cathode and the anode, on a substrate 10. Further, the layered structure is covered with a sealing layer 20. On one side of the organic light-emitting element, a first electrode 30 and a second electrode 40 are extended and protrude. Furthermore, on an opposite surface to a light-emitting surface of the organic light-emitting element 100, liner connection electrodes 50 are provided. The organic light-emitting element 100 may be electrically connected in series to a power supply or another organic light-emitting element by a connection between the electrodes 30 and 40 and a connection between the connection electrodes 50.

Figure 2:
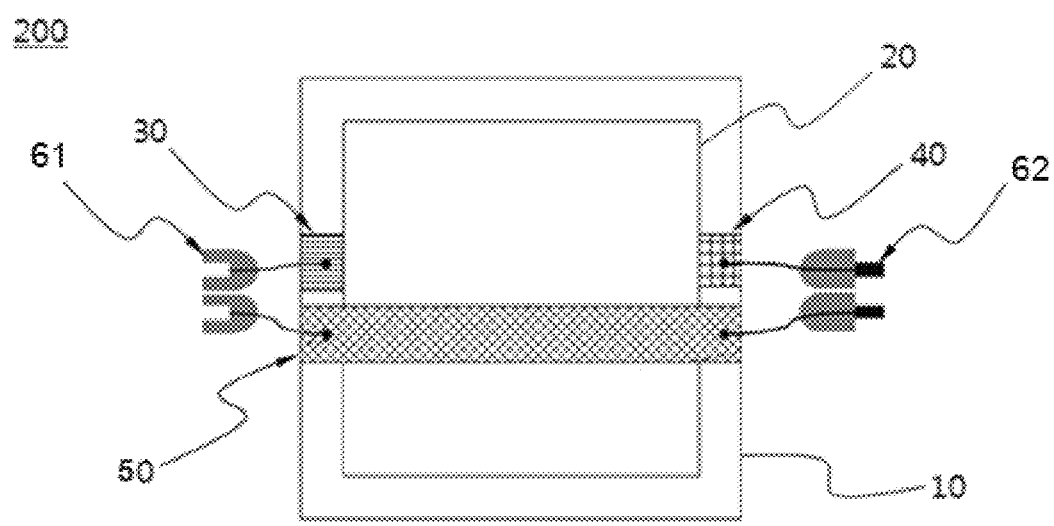
FIG. 2 is a schematic diagram showing an organic light-emitting element according to another exemplary embodiment of the present invention.

FIG. 2 is a schematic diagram showing an organic light-emitting element according to another exemplary embodiment of the present invention. In FIG. 2, the first electrode 30, the second electrode 40, and the connection electrodes 50 include connection terminals 61 and 62. The first electrode 30 and one side of the connection electrode 50 include the connection terminals 61 each having a groove portion, and the second electrode 40 and the other side of the connection electrode 50 include the connection terminals 62 each having a protrusion portion. The connection terminals 61 and 62 included in the first electrode 30, the second electrode 40, and the connection electrodes 50 may be electrically connected to the power supply and another organic light-emitting element in series.

Figure 3:
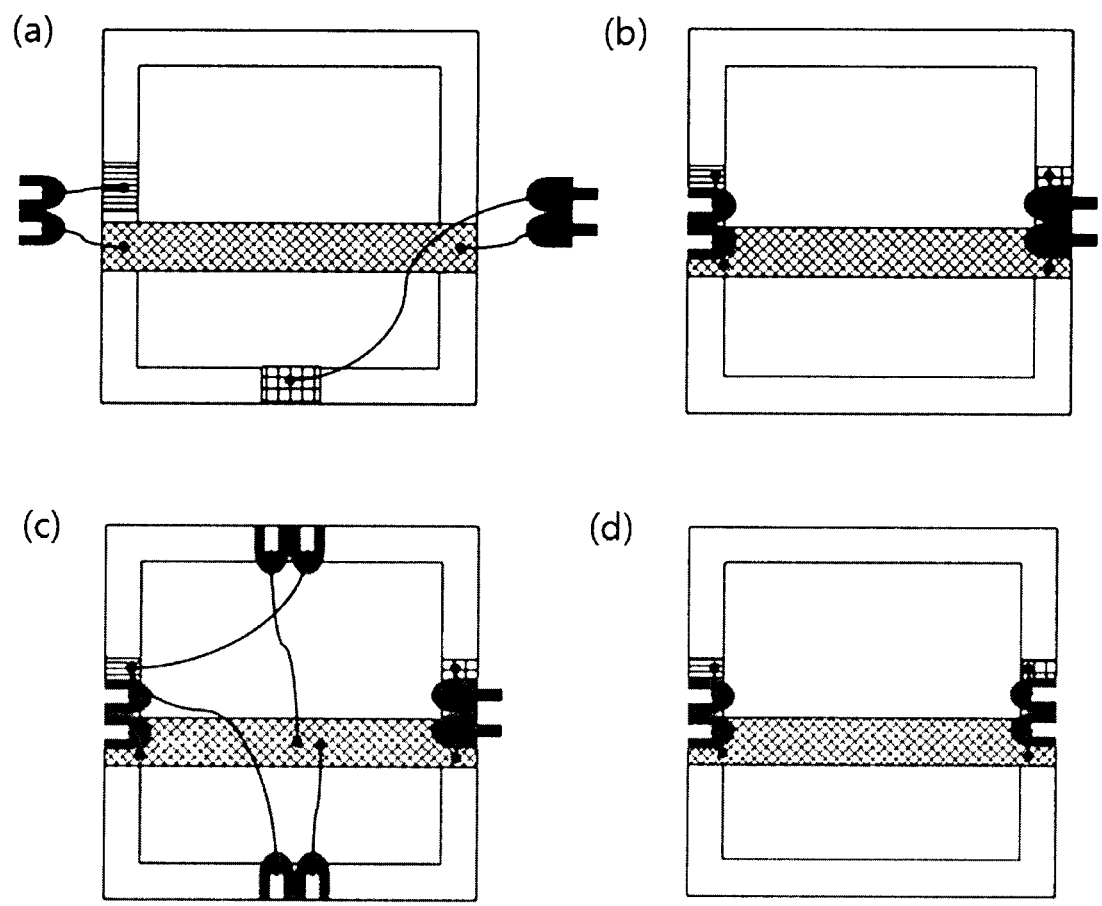
FIG. 3 provides schematic diagrams showing various application examples of an organic light-emitting element according to the present invention.

FIG. 3 illustrates various examples of an organic light-emitting element according to the present invention. FIG. 3A illustrates an organic light-emitting element in which a first electrode and one side of a connection electrode include connection terminals each having a groove portion, and a second electrode and one side of another connection electrode include connection terminals each having a protrusion portion. Further, the first electrode and the second electrode are arranged so as to have an angle of about 90° with each other. FIG. 3B illustrates an organic light-emitting element in which a first electrode and one side of a connection electrode include connection terminals each having a groove portion, and a second electrode and the other side of the connection electrode include connection terminals each having a protrusion portion. Each connection terminal is provided so as not to be out of an area range of the square-shaped organic light-emitting element, and, thus, an integration density of the organic light-emitting element can be increased. FIG. 3C illustrates an organic light-emitting element in which two connection terminals are further provided at a first electrode and a connection electrode, respectively, compared to the structure illustrated in FIG. 3B. In this structure, the number of organic light-emitting elements electrically connected to a single organic light-emitting element can be increased. FIG. 3D illustrates an organic light-emitting element in which a first electrode, a second electrode, and a connection electrode include connection terminals each having a groove portion. This organic light-emitting element can be electrically connected to another organic light-emitting element including connection terminals each having a protrusion portion.

Figure 4:
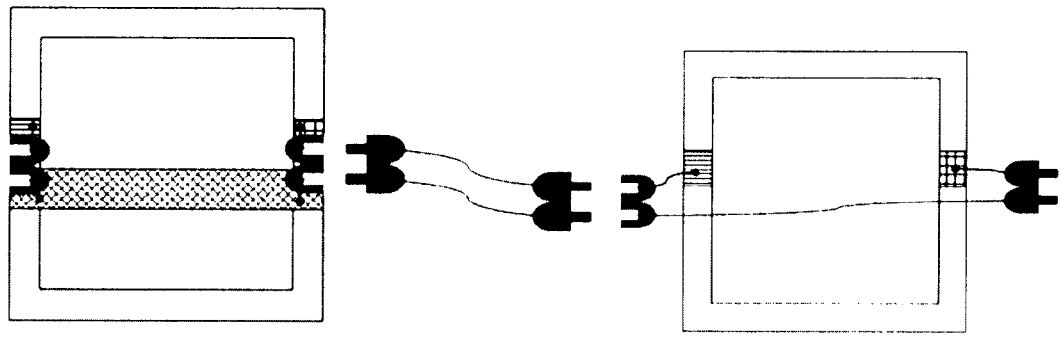
FIG. 4 is a schematic diagram showing a method of electrical connection between organic light-emitting elements using a separate connection member.

FIG. 4 illustrates the organic light-emitting element depicted in FIG. 3D electrically connected to another organic light-emitting element by using a separate extendable connection member. An organic light-emitting element illustrated on the left includes connection terminals each having groove portion at a first electrode, a second electrode, and a connection electrode and may use a separate connection member so as to be electrically connected to another organic light-emitting element. The connection member includes connection terminals each having a protrusion portion. The connection terminals each having a protrusion portion provided in the connection member are engaged with the connection terminals each having a groove portion provided in the organic light-emitting element on the left. An organic light-emitting element illustrated on the right includes electrical wires as connection electrodes. It can be seen that if a connection between connection terminals is available, the organic light-emitting element can be electrically connected to other organic light-emitting elements of various structures.

Figure 5:
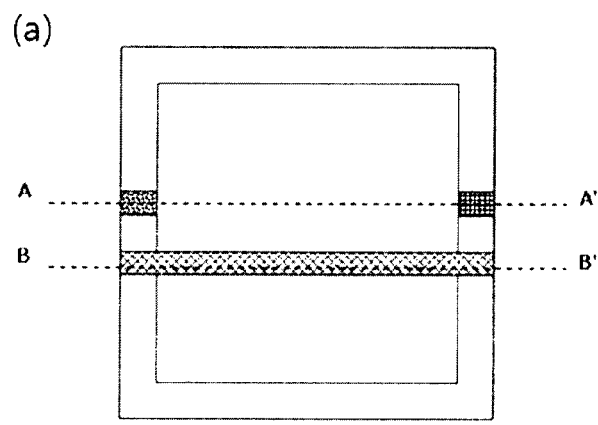
FIG. 5 illustrates an organic light-emitting element and its cross-sectional view according to an exemplary embodiment of the present invention.
Figure 5:
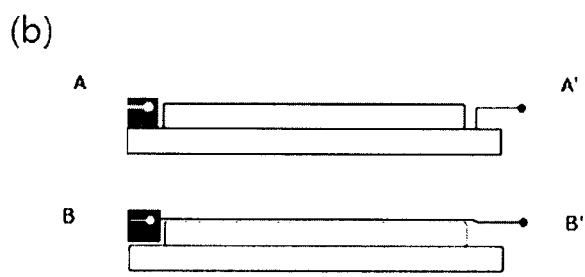

FIG. 5 illustrates a structure (a) of an organic light-emitting element when viewed from the top, and a cross-sectional structure (b) of the organic light-emitting element when viewed from the side, according to an exemplary embodiment of the present invention. Extended portions (indicated by a line A-A') of a first electrode and a second electrode can be electrically connected to a first electrode and a second electrode of another organic light-emitting element, respectively, by connection terminals. Portions (indicated by a line B-B') formed on an opposite surface to a light-emitting surface of a connection electrode can be electrically connected to a connection electrode of another organic light-emitting element by connection terminals, respectively.

Figure 6:
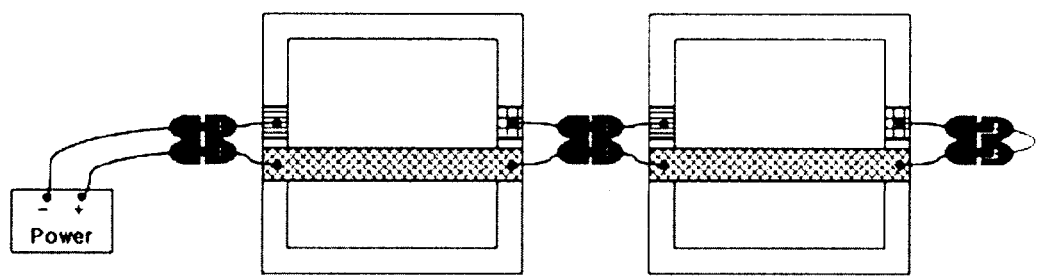
FIGS. 6 and 7 are schematic diagrams of light emitting devices in which multiple organic light-emitting elements are electrically connected according to an exemplary embodiment of the present invention.

FIG. 6 illustrates a light emitting device in which two organic light-emitting elements are electrically connected to a power supply according to an exemplary embodiment of the present invention. A cathode of a first organic light-emitting element connected to the power supply is connected to an anode (+) terminal of the power supply, and a connection electrode of the first organic light-emitting element is connected to a cathode (−) terminal of the power supply. An anode of the first organic light-emitting element is connected to a cathode of a second organic light-emitting element, and a connection terminal of the first organic light-emitting element is connected to a connection terminal of the second organic light-emitting element. An anode of the second organic light-emitting element is connected to the connection terminal of the second organic light-emitting element. Through this process, the two organic light-emitting elements are electrically connected in series to the power supply. In the light emitting device according to the present invention, while a connection between the power supply and the first organic light-emitting element is maintained, an additional organic light-emitting element may be connected to the second organic light-emitting element.

Figure 7:
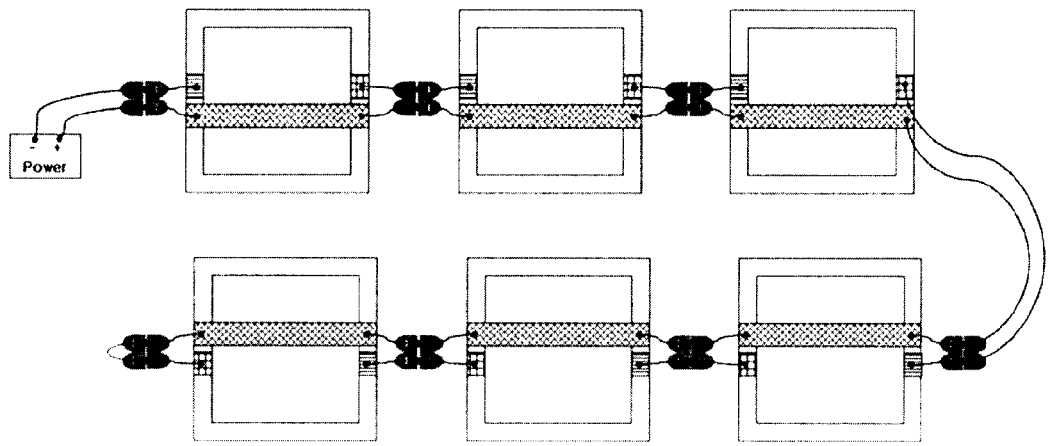

FIG. 7 illustrates a light emitting device in which multiple organic light-emitting elements are electrically connected to a power supply according to an exemplary embodiment of the present invention. The light emitting device illustrated in FIG. 7 has the same electrical connection structure as the light emitting device illustrated in FIG. 6, except that the number of organic light-emitting elements electrically connected to a first organic light-emitting element connected to the power supply is increased.

DESCRIPTION OF MAIN REFERENCE NUMERALS OF DRAWINGS

10: Substrate
20: Sealing layer
30: Extension portion of first electrode
40: Extension portion of second electrode
50: Connection electrode
61, 62: Connection terminals
100, 200: Organic light-emitting elements

INDUSTRIAL APPLICABILITY

An organic light-emitting element according to the present invention can be implemented as large-scale lighting or display devices of various structures.

What is claimed is:

1. A light-emitting device comprising two or more organic light-emitting elements electrically connected in series,
wherein the organic light-emitting element comprises:
a first electrode;
a second electrode; and
an organic layer interposed between the first electrode and the second electrode,
wherein a connection electrode for electrically connecting two or more organic light-emitting elements in series is formed on an opposite surface to a light-emitting surface of the organic light-emitting elements,
wherein each of the first electrode and the second electrode includes one or more connection terminal that has an electrical connection portion,
wherein a connection terminal of the first electrode is electrically connected to a power supply or a connection terminal of a second electrode of another organic light-emitting element, the connection terminal of the second electrode is electrically connected to a connection terminal of a first electrode of still another organic light-emitting element, and the connection electrode formed on the opposite surface to a light-emitting surface of the organic light-emitting element is electrically connected to the power supply or a connection electrode of organic light-emitting element,
wherein a first electrode of a first organic light-emitting element connected to a power supply is connected to an anode (+) terminal of the power supply, and a connection terminal of the first organic light-emitting element is connected to a cathode (−) terminal of the power supply; and or a second electrode of a first organic light-emitting element connected to a power supply is connected to a cathode (−) terminal of the power supply, and a connection terminal of the first organic light-emitting element is connected to an anode (+) terminal of the power supply,
wherein a first electrode of an $n^{th}$ organic light-emitting element (n is an integer between 0 and k−1, while k is an integer of 2 or more) connected between the first organic light-emitting element and a $k^{th}$ organic light-emitting element is connected to a second electrode of a $(n-1)^{th}$ organic light-emitting element, and a connection electrode of the nth organic light-emitting element is connected to a connection electrode of the $(n-1)^{th}$ organic light-emitting element; and a first electrode of the kth organic light-emitting element is connected to a second electrode of a $(k-1)^{th}$ organic light-emitting element, a connection electrode of the kth organic light-emitting element is connected to a connection electrode of the $(k-1)^{th}$ organic light-emitting element, and a second electrode of the kth organic light-emitting element is connected to the connection electrode of the $k^{th}$ organic light-emitting element, and
wherein the connection terminal includes a covered electrical wire, and
wherein connection terminals connected to the first electrode and one side of the connection electrode include groove portions, and connection terminals connected to the second terminal and the other side of the connection electrode include protrusion portions, and
a contact between connection terminals is made by means of engagement between a connection terminal including a groove portion and a connection terminal including a protrusion portion.

2. The light-emitting element of claim 1,
wherein connection terminals connected to the second electrode and one side of the connection electrode include groove portions, and connection terminals connected to the first electrode and the other side of the connection electrode include protrusion portions, and
a contact between connection terminals is made by means of engagement between a connection terminal including a groove portion and a connection terminal including a protrusion portion.

3. The light-emitting device of claim 1,
wherein the power supply includes a constant current driver.

4. A light-emitting device comprising two or more organic light-emitting elements electrically connected in series,
wherein the organic light-emitting element comprises:
a first electrode;
a second electrode; and
an organic layer interposed between the first electrode and the second electrode,
wherein a connection electrode for electrically connecting two or more organic light-emitting elements in series is formed on an opposite surface to a light-emitting surface of the organic light-emitting elements,
wherein each of the first electrode and the second electrode includes one or more connection terminal that has an electrical connection portion,
wherein a connection terminal of the first electrode is electrically connected to a power supply or a connection terminal of a second electrode of another organic light-emitting element, the connection terminal of the second electrode is electrically connected to a connection terminal of a first electrode of still another organic light-emitting element, and the connection electrode formed on the opposite surface to a light-emitting surface of the organic light-emitting element is electrically connected to the power supply or a connection electrode of organic light-emitting element,
wherein a first electrode of a first organic light-emitting element connected to a power supply is connected to an anode (+) terminal of the power supply, and a connection terminal of the first organic light-emitting element is connected to a cathode (−) terminal of the power supply; or a second electrode of a first organic light-emitting element connected to a power supply is connected to a cathode (−) terminal of the power supply, and a connection terminal of the first organic light-emitting element is connected to an anode (+) terminal of the power supply,
wherein a first electrode of an $n^{th}$ organic light-emitting element (n is an integer between 0 and k−1, while k is an integer of 2 or more) connected between the first organic light-emitting element and a $k^{th}$ organic light-emitting element is connected to a second electrode of a $(n-1)^{th}$ organic light-emitting element, and a connection electrode of the $n^{th}$ organic light-emitting element is connected to a connection electrode of the $(n-1)^{th}$ organic light-emitting element; and a first electrode of the $k^{th}$ organic light-emitting element is connected to a second electrode of a $(k-1)^{th}$ organic light-emitting element, a connection electrode of the $k^{th}$ organic light-emitting element is connected to a connection electrode of the $(k-1)^{th}$ organic light-emitting element, and a second electrode of the $k^{th}$ organic light-emitting element is connected to the connection electrode of the $k^{th}$ organic light-emitting element, and
wherein the connection terminal includes a metal tape, and
wherein connection terminals connected to the first electrode and one side of the connection electrode include groove portions, and connection terminals connected to the second terminal and the other side of the connection electrode include protrusion portions, and a contact between connection terminals is made by means of engagement between a connection terminal including a groove portion and a connection terminal including a protrusion portion.

5. The light-emitting element of claim 4,
wherein connection terminals connected to the second electrode and one side of the connection electrode include groove portions, and connection terminals connected to the first electrode and the other side of the connection electrode include protrusion portions, and
a contact between connection terminals is made by means of engagement between a connection terminal including a groove portion and a connection terminal including a protrusion portion.

6. The light-emitting device of claim 4,
wherein the power supply includes a constant current driver.

7. A light-emitting device comprising two or more organic light-emitting elements electrically connected in series,
wherein the organic light-emitting element comprises:
a first electrode;
a second electrode; and
an organic layer interposed between the first electrode and the second electrode,
wherein a connection electrode for electrically connecting two or more organic light-emitting elements in series is formed on an opposite surface to a light-emitting surface of the organic light-emitting elements,
wherein each of the first electrode and the second electrode includes one or more connection terminal that has an electrical connection portion,
wherein a connection terminal of the first electrode is electrically connected to a power supply or a connection terminal of a second electrode of another organic light-emitting element, the connection terminal of the second electrode is electrically connected to a connection terminal of a first electrode of still another organic light-emitting element, and the connection electrode formed on the opposite surface to a light-emitting surface of the organic light-emitting element is electrically connected to the power supply or a connection electrode of organic light-emitting element,
wherein a first electrode of a first organic light-emitting element connected to a power supply is connected to an anode (+) terminal of the power supply, and a connection terminal of the first organic light-emitting element is connected to a cathode (−) terminal of the power supply; or a second electrode of a first organic light-emitting element connected to a power supply is connected to a cathode (−) terminal of the power supply, and a connection terminal of the first organic light-emitting element is connected to an anode (+) terminal of the power supply,
wherein a first electrode of an $n^{th}$ organic light-emitting element (n is an integer between 0 and k−1, while k is an integer of 2 or more) connected between the first organic light-emitting element and a $k^{th}$ organic light-emitting element is connected to a second electrode of a $(n-1)^{th}$ organic light-emitting element, and a connection electrode of the nth organic light-emitting element is connected to a connection electrode of the $(n-1)^{th}$ organic light-emitting element; and a first electrode of the $k^{th}$ organic light-emitting element is connected to a second electrode of a $(k-1)^{th}$ organic light-emitting element, a connection electrode of the $k^{th}$ organic light-emitting element is connected to a connection electrode of the $(k-1)^{th}$ organic light-emitting element, and a second electrode of the $k^{th}$ organic light-emitting element is connected to the connection electrode of the $k^{th}$ organic light-emitting element, and
wherein the connection terminal includes a FPCB, and
wherein connection terminals connected to the first electrode and one side of the connection electrode include groove portions, and connection terminals connected to the second terminal and the other side of the connection electrode include protrusion portions, and
a contact between connection terminals is made by means of engagement between a connection terminal including a groove portion and a connection terminal including a protrusion portion.

8. The light-emitting element of claim 7,
wherein connection terminals connected to the second electrode and one side of the connection electrode include groove portions, and connection terminals connected to the first electrode and the other side of the connection electrode include protrusion portions, and
a contact between connection terminals is made by means of engagement between a connection terminal including a groove portion and a connection terminal including a protrusion portion.

9. The light-emitting device of claim 7,
wherein the power supply includes a constant current driver.

* * * * *